(12) United States Patent
Furumiya et al.

(10) Patent No.: US 7,414,506 B2
(45) Date of Patent: Aug. 19, 2008

(54) SEMICONDUCTOR INTEGRATED CIRCUIT AND FABRICATION METHOD THEREOF

(75) Inventors: Masayuki Furumiya, Kanagawa (JP); Ryota Yamamoto, Kanagawa (JP)

(73) Assignee: NEC Electronics Corporation, Tokyo (JP)

( * ) Notice: Subject to any disclaimer, the term of this patent is extended or adjusted under 35 U.S.C. 154(b) by 0 days.

(21) Appl. No.: 11/017,074

(22) Filed: Dec. 21, 2004

(65) Prior Publication Data
US 2005/0134419 A1  Jun. 23, 2005

(30) Foreign Application Priority Data
Dec. 22, 2003  (JP)  ............ 2003-425951

(51) Int. Cl.
*H01F 5/00* (2006.01)
(52) U.S. Cl. ............ 336/200
(58) Field of Classification Search ............ 336/65, 336/83, 200, 232; 257/531
See application file for complete search history.

(56) References Cited
U.S. PATENT DOCUMENTS

| | | | | |
|---|---|---|---|---|
| 5,396,101 A | * | 3/1995 | Shiga | 257/531 |
| 5,515,022 A | * | 5/1996 | Tashiro et al. | 336/200 |
| 5,532,667 A | * | 7/1996 | Haertling et al. | 336/177 |
| 5,852,866 A | * | 12/1998 | Kuettner et al. | 29/608 |
| 5,945,902 A | * | 8/1999 | Lipkes et al. | 336/200 |
| 6,198,374 B1 | * | 3/2001 | Abel | 336/200 |
| 7,053,165 B2 | * | 5/2006 | Furumiya et al. | 257/531 |
| 2002/0050626 A1 | * | 5/2002 | Onuma et al. | 257/531 |
| 2003/0095026 A1 | * | 5/2003 | Kawanobe | 336/200 |
| 2004/0164835 A1 | * | 8/2004 | Shoji | 336/200 |
| 2005/0190035 A1 | * | 9/2005 | Wang | 336/200 |

FOREIGN PATENT DOCUMENTS

| | | |
|---|---|---|
| JP | S61-161747 A | 7/1986 |
| JP | H03-28758 U | 3/1991 |
| JP | H04-63653 U | 5/1992 |
| JP | 05-013234 * | 1/1993 |
| JP | 05-013235 * | 1/1993 |

* cited by examiner

*Primary Examiner*—Tuyen T. Nguyen
(74) *Attorney, Agent, or Firm*—Sughrue Mion, PLLC

(57) ABSTRACT

A multilayer interconnection layer is provided on a semiconductor substrate. An inductor is provided on an insulating layer that forms the uppermost layer of the multilayer interconnection layer. The inductor is formed by spirally arranging a single wiring. On the insulating layer, a multilayer structure body is provided in an inner region of the inductor. In the multilayer structure body, a plurality of ferromagnetic cores formed of Ni are arranged in a matrix. The height of each ferromagnetic core is equal to or larger than the width thereof.

17 Claims, 10 Drawing Sheets

SEMICONDUCTOR INTEGRATED CIRCUIT AND FABRICATION METHOD THEREOF

BACKGROUND OF THE INVENTION

1. Field of the Invention

The present invention relates to a semiconductor integrated circuit including an inductor and a fabrication method thereof.

2. Description of the Related Art

Figure 1:
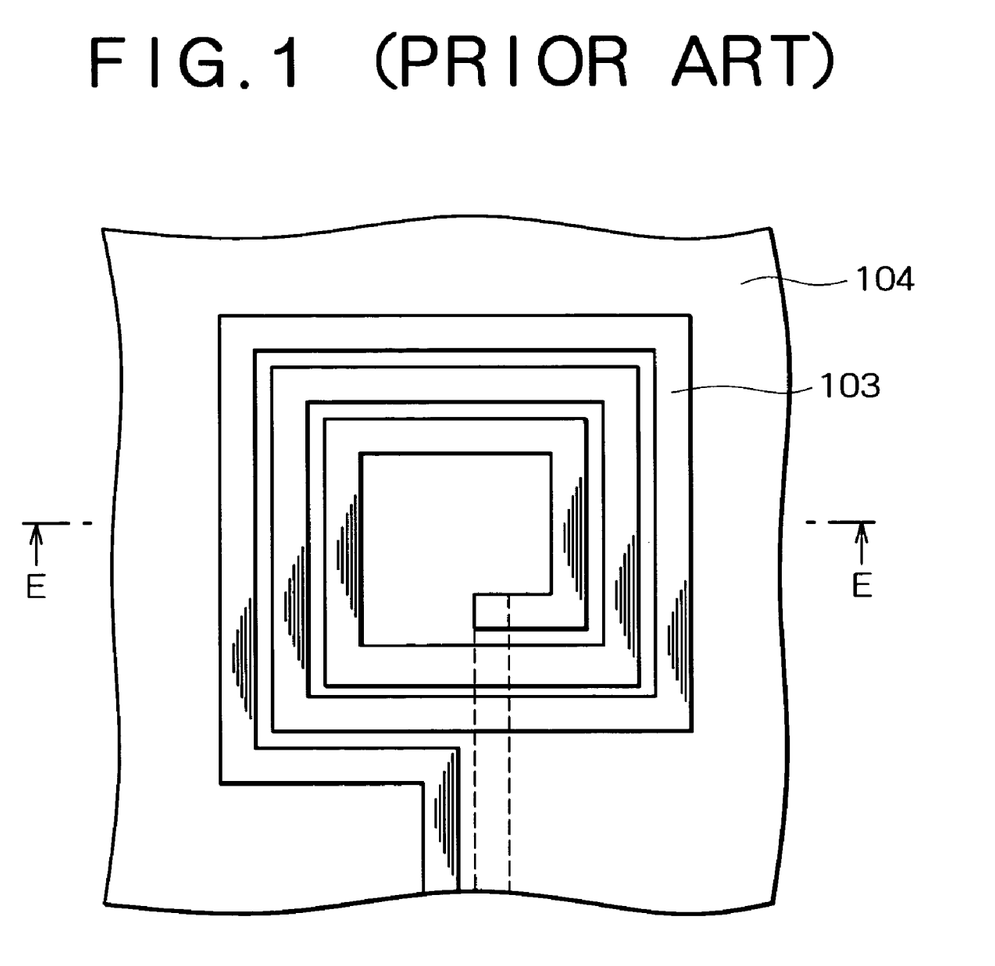
FIG. 1 is a plan view of a conventional semiconductor integrated circuit.
Figure 2:
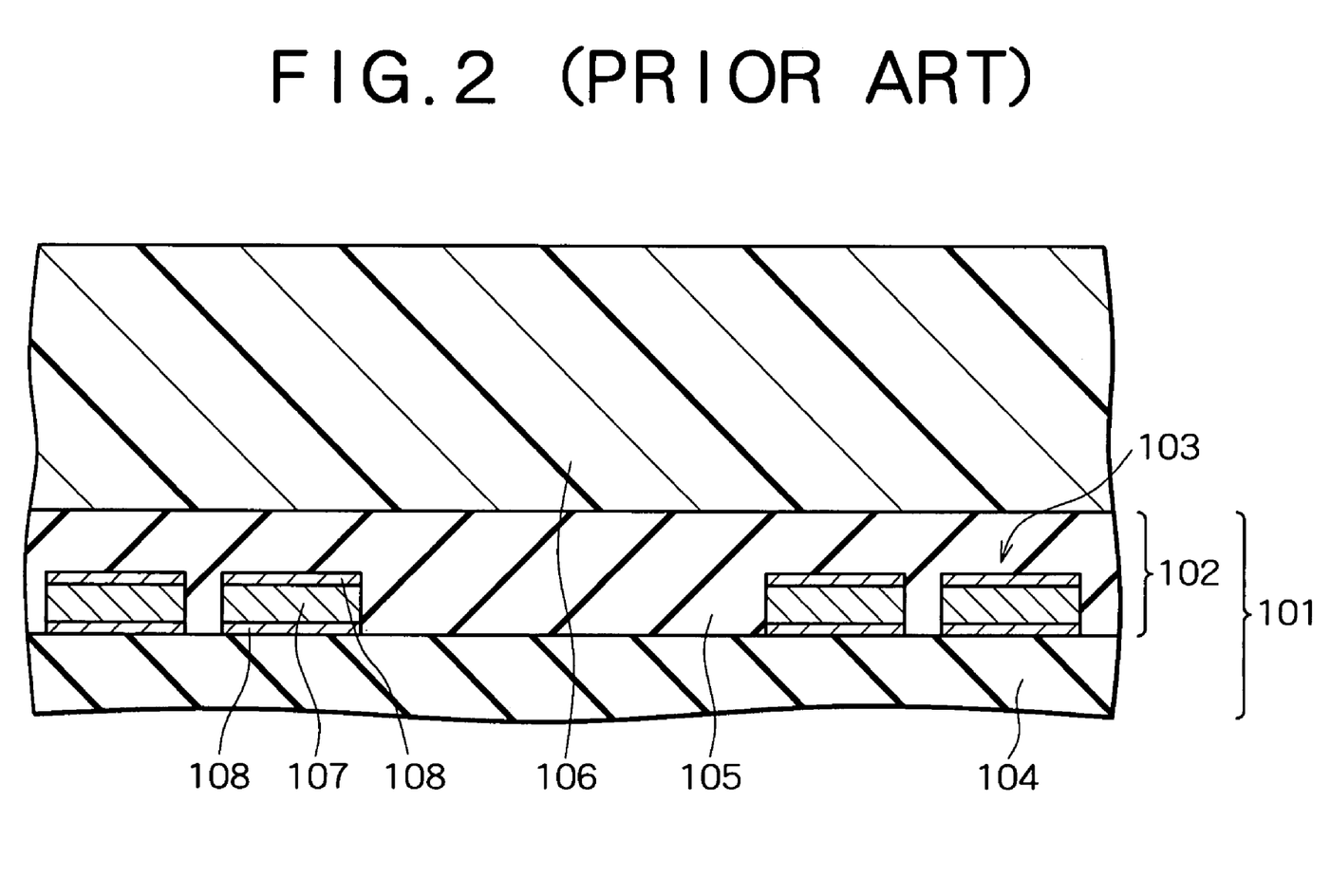
FIG. 2 is a cross-sectional view of the conventional semiconductor integrated circuit, taken along the line E-E in FIG. 1.

FIG. 1 is a plan view of a conventional semiconductor integrated circuit, and FIG. 2 is a cross-sectional view thereof, taken along the line E-E in FIG. 1. As shown in FIGS. 1 and 2, in this conventional semiconductor integrated circuit, a multilayer interconnection layer 101 is provided on a semiconductor substrate (not shown). In the uppermost layer 102 of the multilayer interconnection layer 101, an inductor 103 is provided. The inductor 103 is a spiral inductor. In other words, on an insulating layer 104 formed of $SiO_2$ in the multilayer interconnection layer 101, the inductor 103 is provided. The inductor 103 is formed by a single wiring that is spirally arranged. In addition, an insulating layer 105 formed of $SiO_2$ is provided to cover the inductor 103. An insulating layer 106 formed of polyimide is provided on the insulating layer 105. In FIG. 1, the insulating layers 105 and 106 are not shown.

The wiring constituting the inductor 103 is formed by covering an upper surface and a lower surface of a wiring body layer 107 formed of copper or aluminum with TiW layers 108. The reason why the inductor 103 is provided in the uppermost layer 102 of the multilayer interconnection layer 101 is to make a parasitic capacitance between the inductor 103 and the semiconductor substrate as small as possible and to make the thickness of the wiring of the inductor 103 as thick as possible so as to reduce a series resistance, thereby improving a Q value of the inductor 103.

However, this conventional semiconductor integrated circuit has the following problem. Even in the case where the inductor 103 is arranged in the uppermost layer 102 of the multilayer interconnection layer 101, the upper limit of the thickness of the inductor 103 is several microns because the thickness of the uppermost layer 102 is about 10 μm at a maximum. Thus, loss of inductance is large and the Q value is as low as about 5 to about 10. Moreover, in order to obtain inductance of 10 nH, for example, the inductor 103 should be formed in the shape of a square spiral having a side of 200 to 300 μm. That is, an area occupied by the inductor 103 is very large. This prevents miniaturization of the semiconductor integrated circuit.

Thus, Japanese Utility-Model Laid-Open Publication No. Hei 3-28758 discloses a technique for providing the ferromagnetic layer in a layer upper than the inductor. According to this technique, the ferromagnetic layer is provided directly above a region corresponding to the inside of the spiral formed by the wiring of the inductor. In addition, Japanese Utility-Model Laid-Open Publication No. Hei 4-63653 discloses a technique for providing the ferromagnetic layer above or below the inductor. According to this technique, the ferromagnetic layer is provided to cover the inductor, when seen from a direction perpendicular to a surface of a substrate. Furthermore, Japanese Patent Laid-Open Publication No. Sho 61-161747 discloses a technique for providing the ferromagnetic layer above the inductor. This publication describes that provision of the ferromagnetic layer increases inductance of the inductor.

However, the aforementioned conventional techniques have the following problem. In each of the semiconductor integrated circuits described in Japanese Utility-Model Laid-Open Publications Nos. Hei 3-28758 and Hei 4-63653 and Japanese Patent Laid-Open Publication No. Sho 61-161747, the inductance and the Q value of the inductor are not sufficient. In order to obtain a predetermined magnitude of inductance, each semiconductor integrated circuit requires an inductor having a larger area. Thus, it is not-possible to sufficiently miniaturize the semiconductor integrated circuit.

SUMMARY OF THE INVENTION

A semiconductor integrated circuit according to the present invention comprises: an inductor provided on a substrate; and a ferromagnetic core provided in an inner region of the inductor when seen from a direction perpendicular to a surface of the substrate. And, a length of the ferromagnetic core in the direction perpendicular to the surface of the substrate is equal to or larger than a length thereof in a direction parallel to the surface of the substrate.

According to the present invention, the ferromagnetic core serves as a magnetic core of the inductor. Since the length of the ferromagnetic core in the direction perpendicular to the surface of the substrate, i.e., the height of the ferromagnetic core, is equal to or larger than the length thereof in the direction parallel to the surface of the substrate, i.e., the width thereof, the ferromagnetic core can be easily magnetized in a direction of a magnetic field induced by the inductor, i.e., in the direction perpendicular to the surface of the substrate. Thus, the inductance and the Q value of the inductor can be improved. Therefore, an area occupied by the inductor can be reduced and the size of the semiconductor integrated circuit can be reduced.

It is preferable that the length of the ferromagnetic core in the direction perpendicular to the surface of the substrate is equal to or larger than twice the length thereof in the direction parallel to the surface of the substrate. In this case, it is possible to magnetize the ferromagnetic core in the direction of the magnetic field induced by the inductor more stably.

It is preferable that a plurality of ferromagnetic cores be provided. In this case, the width (the length in the direction parallel to the surface of the substrate) of each ferromagnetic core is reduced. Thus, it is possible to make the height (the length in the direction perpendicular to the surface of the substrate) of the ferromagnetic core larger than the width thereof without making the height excessively large.

Moreover, the plurality of ferromagnetic cores are preferably arranged in a matrix. In this case, a larger number of ferromagnetic cores can be arranged in a limited region.

It is preferable that the semiconductor integrated circuit of the present invention further comprise: a first metal layer provided in the region corresponding to the inner region of the inductor and below the ferromagnetic core; and a second metal layer provided to cover an upper surface and side faces of the ferromagnetic core. This can prevent diffusion of the material of the ferromagnetic core to other regions in the semiconductor integrated circuit.

It is preferable that an upper surface of the second metal layer be located in an upper level than an upper surface of the inductor. In this case, a current can flow through the upper surface of the inductor because of a skin effect, thus reducing a resistance value. As a result, the Q value of the inductor can be improved.

A method for fabricating a semiconductor integrated circuit according to the present invention comprises the steps of: forming an inductor on a substrate; and forming a ferromagnetic core in an inner region of the inductor, when seen from a direction perpendicular to a surface of the substrate, in such a manner that a length of the ferromagnetic core in the direction perpendicular to the surface of the substrate is equal to or larger than a length thereof in a direction parallel to the surface of the substrate.

Another method for fabricating a semiconductor integrated circuit according to the present invention comprises the steps of: forming a first metal layer on a substrate; forming a ferromagnetic core selectively on the first metal layer in such a manner that a length of the ferromagnetic core in a direction perpendicular to a surface of the substrate is equal to or larger than a length thereof in a direction parallel to the surface of the substrate; forming a second metal layer to cover the ferromagnetic core; and selectively removing and patterning the first and second metal layers to form a multilayer structure body including the first metal layer, the ferromagnetic core, and the second metal layer, and to form an inductor, including the first metal layer and the second metal layer, in the same level as the multilayer structure body to surround the multilayer structure body.

Still another method for fabricating a semiconductor integrated circuit according to the present invention comprises the steps of: forming an inductor on a substrate; forming a first metal layer on the substrate in an inner region of the inductor, when seen from a direction perpendicular to a surface of the substrate; forming a ferromagnetic core on the first metal layer in such a manner that a length of the ferromagnetic core in the direction perpendicular to the surface of the substrate is equal to or larger than a length thereof in a direction parallel to the surface of the substrate; forming a second metal layer to cover the ferromagnetic core; and selectively removing and patterning the first and second metal layers to form a multilayer structure body including the first metal layer, the ferromagnetic core, and the second metal layer.

According to the present invention, the ferromagnetic core serves as a magnetic core of the inductor. In addition, the length of the ferromagnetic core in the direction perpendicular to the surface of the substrate is equal to or larger than the length thereof in the direction parallel to the surface of the substrate. Therefore, the ferromagnetic core can be easily magnetized in a direction of a magnetic field induced by the inductor, thus improving the inductance and the Q value of the inductor. As a result, an area occupied by the inductor can be reduced and the size of the semiconductor integrated circuit can be reduced.

BRIEF DESCRIPTION OF THE DRAWINGS

FIGS. 6A and 6B are diagrams showing an effect of a shape of a ferromagnetic core on a magnetizing direction; FIG. 6A showing a case where the ferromagnetic core has the height smaller than the width; and FIG. 6B showing a case where the ferromagnetic core has the height larger than the width;

DETAILED DESCRIPTION OF THE PREFERRED EMBODIMENTS

Figure 3:
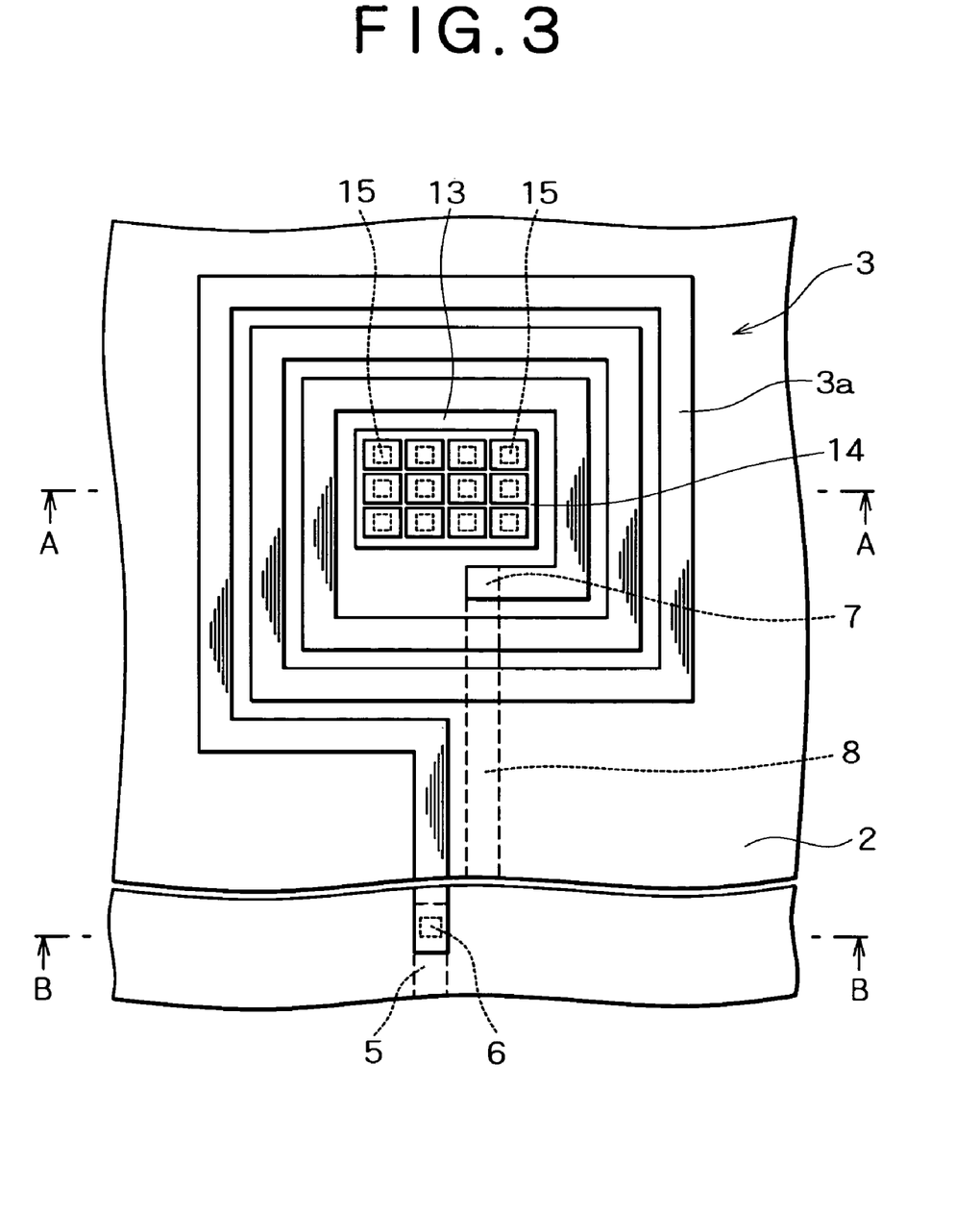
FIG. 3 is a plan view of a semiconductor integrated circuit according to a first embodiment of the present invention.

Preferred embodiments of the present invention will be now described with reference to the accompanying drawings. A first embodiment of the present invention will be described. FIG. 3 is a plan view of a semiconductor integrated circuit of the present embodiment, and FIGS. 4 and 5 are cross-sectional views of that semiconductor integrated circuit, taken along the line A-A and the line B-B in FIG. 3, respectively.

Figure 4:
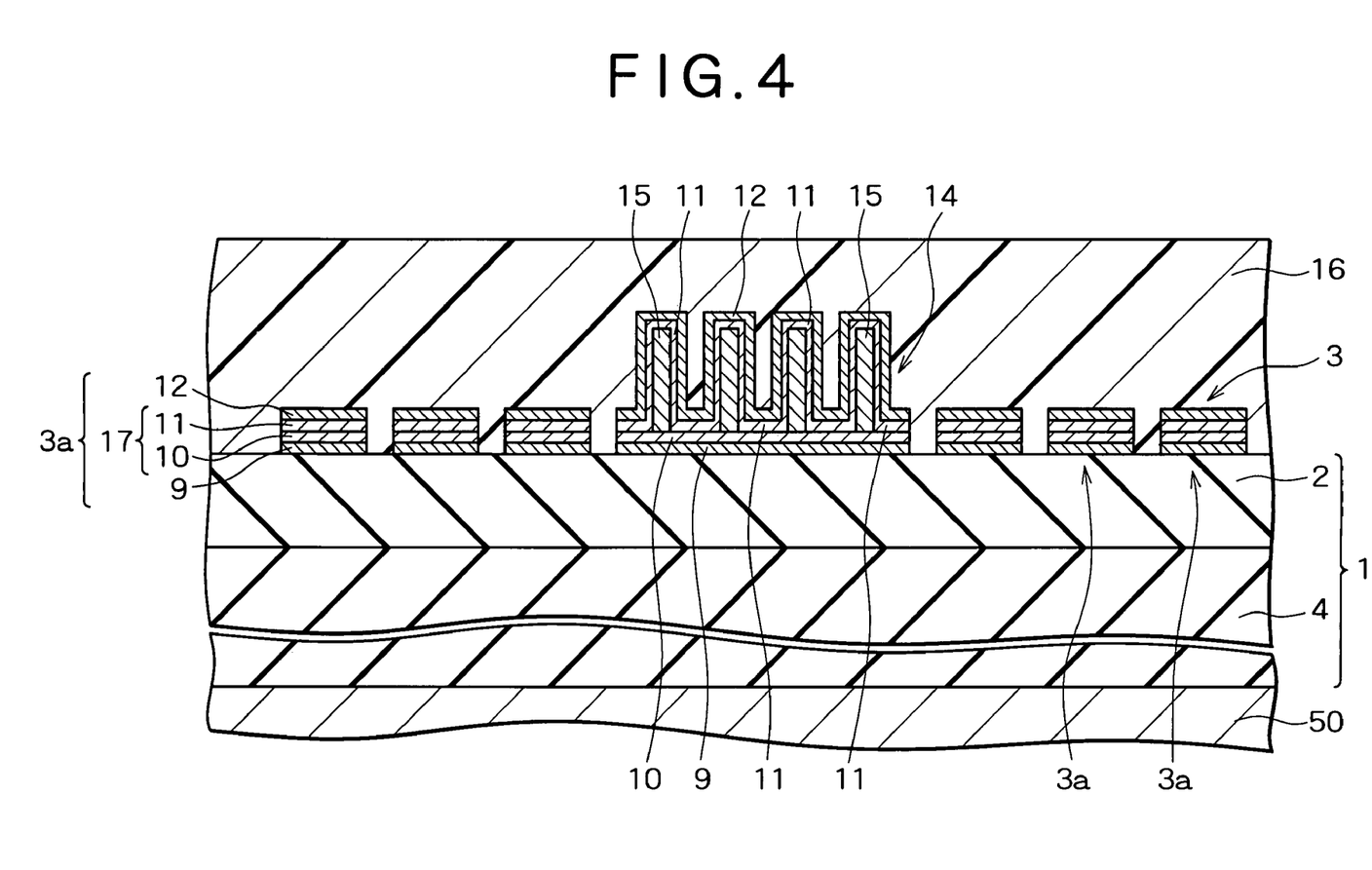
FIG. 4 is a cross-sectional view of the semiconductor integrated circuit shown in FIG. 3, taken along the line A-A in FIG. 3.
Figure 5:
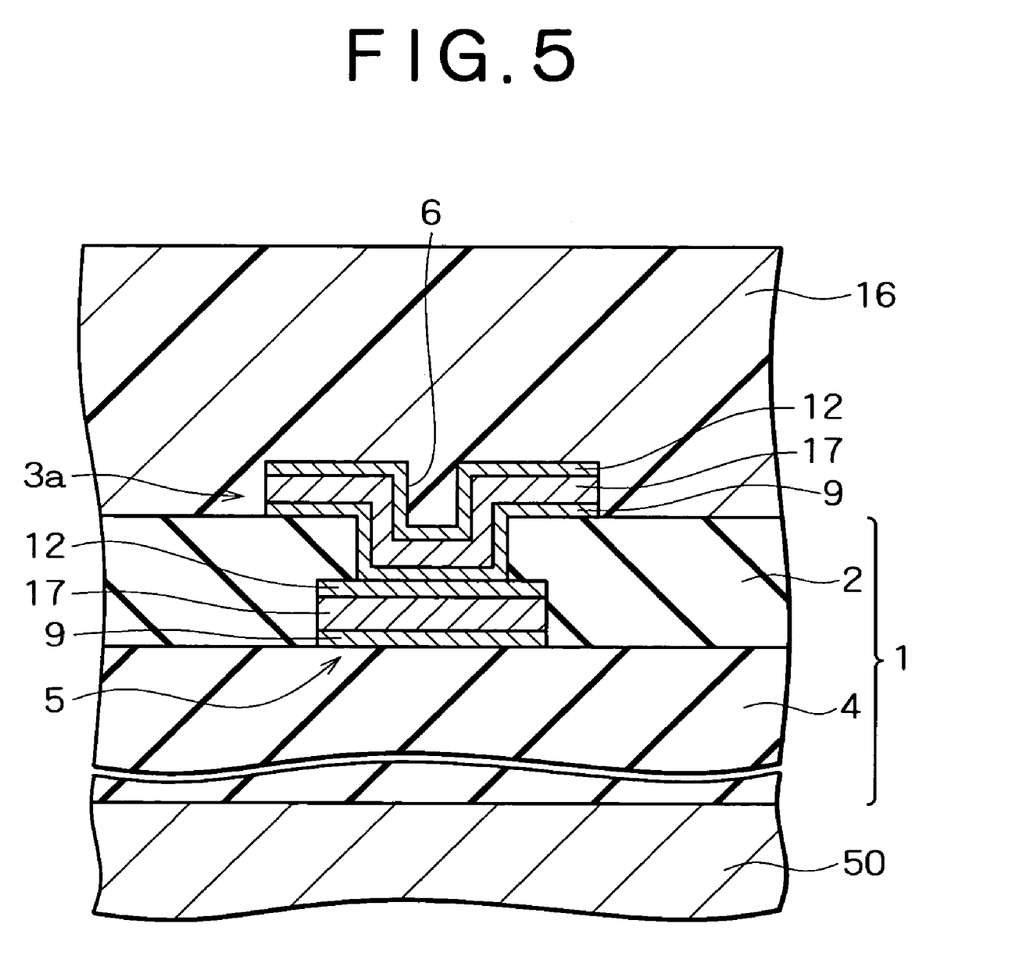
FIG. 5 is a cross-sectional view of the semiconductor integrated circuit shown in FIG. 3 taken along the line B-B in FIG. 3.

As shown in FIGS. 3 to 5, in the semiconductor integrated circuit of the present embodiment, a multilayer interconnection layer 1 is provided on a semiconductor substrate 50 that is formed of silicon, for example. The multilayer interconnection layer 1 is formed of a plurality of layers. On an insulating layer 2 that forms the uppermost layer of the multilayer interconnection layer 1, an inductor 3 is provided. The inductor 3 is a spiral inductor. The inductor 3 is formed of a single wiring 3a that is spirally arranged. The thickness of the insulating layer 2 is 1.5 µm, for example. When seen from a direction perpendicular to a surface of the semiconductor substrate 50 (hereinafter, this is phrased by "in a plan view"), the outer shape of the inductor 3 is a square having a side of 100 µm; the inner shape thereof is a square having a side of 40 to 60 µm; the width of the wiring 3a is 5 to 10 µm; and the winding number of the inductor 3 is three, for example. Below the insulating layer 2, an insulating layer 4 is provided. The insulating layers 2 and 4 are formed of $SiO_2$, for example.

In a region of the insulating layer 2 which is away from the inductor 3, a wiring 5 is embedded. In a region of the insulating layer 2, that is located directly above the wiring 5, a via hole 6 is formed. One end of the wire 3a is drawn from the outer side of the inductor 3 to the via hole 6 and is connected to the wiring 5 through the via hole 6. Moreover, another via hole 7 is formed in a region of the insulating layer 2, the region corresponding to an inner region of the inductor 3. The other end of the wiring 3a is connected to a wiring 8 arranged in a lower layer than the inductor 3 through the via hole 7. That is, the wiring 5, the via hole 6, the wiring 3a, the via hole 7, and the wiring 8 are connected in series in that order.

The wirings 3a, 5, and 8 are formed of a TiW layer 9, a Cu layer 10, a Cu layer 11, and a TiW layer 12 formed in that order from the bottom. The thickness of each of the TiW layers 9 and 12 is 0.05 to 0.1 µm, for example, and the thickness of each of the Cu layers 10 and 11 is 0.2 to 0.4 µm, for example. The thickness of each of the wirings 3a, 5 and 8 is 0.5 to 1.0 µm, for example. The Cu layers 10 and 11 form a wiring body layer 17. The TiW layers 9 and 12 are barrier-metal layers for the wiring body layer 17, which prevent diffusion of Cu forming the Cu layers 10 and 11 to other regions in the semiconductor integrated circuit. In addition, the TiW layer 9 has an effect of improving adhesion between the Cu layer and the insulating layer 2 formed of $SiO_2$.

Moreover, on the insulating layer 2, a multilayer structure body 14 is provided in the inner region of the inductor 3, i.e., in the inside of the spiral formed by the wiring 3a (hereinafter, this region is referred to as an inner region 13). The inner region 13 is a rectangular region having a side of 40 to 60 µm, for example, and the shape of the multilayer structure body 14 is a square having a side of 30 to 50 µm, for example, in a plan view. The lower surface of the multilayer structure body 14 and the lower surface of the wiring 3a are located on the same plane and are in contact with the upper surface of the insulating layer 2. In the multilayer structure body 14, the TiW layer 9 and the Cu layer 10 are provided in that order from the bottom.

On the Cu layer 10, a plurality of ferromagnetic cores 15 are provided. The ferromagnetic cores 15 are formed of a ferromagnetic material, for example, Ni, and are arranged in a matrix on the Cu layer 10 in a plan view. In each ferromagnetic core 15, the length in a direction perpendicular to the surface of the semiconductor substrate 50 (hereinafter, referred to as a height) is equal to or larger than the length thereof in a direction parallel to the surface of the semiconductor substrate 50 (hereinafter, referred to as a width). For example, the height of the ferromagnetic core 15 is equal to or larger than twice the width thereof. In other words, in a cross section perpendicular to the surface of the semiconductor substrate 50, as shown in FIG. 4, an aspect ratio of the ferromagnetic core 15, i.e., a ratio of the height to the width is equal to or larger than 1, for example, is equal to or larger than 2. For example, the height of the ferromagnetic core 15 is 3 to 5 µm, and the width thereof is 1 to 3 µm. The distance between the adjacent ferromagnetic cores 15 is 1 to 3 µm, for example.

The shape of the ferromagnetic core 15 is a cylinder or a square pole with rounded corners, which extends in the direction perpendicular to the surface of the semiconductor substrate 50 (hereinafter, referred to as a height direction), for example. Although FIG. 3 only shows twelve ferromagnetic cores 15 for the sake of convenience, the number of the ferromagnetic cores 15 is not limited to twelve.

The Cu layer 11 is provided to cover the Cu layer 10 and the ferromagnetic core 15 in the multilayer structure body 14. In other word, the Cu layer 11 is provided to cover a region of the upper surface of the Cu layer 10, which is not covered with the ferromagnetic core 15, and to cover the upper surface and side faces of the ferromagnetic core 15. Moreover, the TiW layer 12 is provided to cover the Cu layer 11. The lower surface of the ferromagnetic core 15 is located in a lower level than the upper surface of the wiring 3a, while the upper surface of the ferromagnetic core 15 is located in an upper level than the lower surface of the wiring 3a. Therefore, the lower part of the ferromagnetic core 15 is in the same level as the upper part of the wiring 3a. In addition, the upper surface of the ferromagnetic core 15 is located in the upper level than the upper surface of the wiring 3a. Therefore, the upper surface of the multilayer structure body 14 is in the upper level than the upper surface of the wiring 3a. Furthermore, an insulating layer 16 formed of polyimide, for example, is provided to cover the inductor 3 and the multilayer structure body 14. In FIG. 3, the insulating layer 16 is not shown. A device such as a transistor may be formed on the surface of the semiconductor substrate 50.

Next, an operation of the semiconductor device having the aforementioned structure according to the present embodiment will be described. As shown in FIGS. 3 to 5, when an alternating current is made to flow through the wiring 3a via the wirings 5 and 8, the wiring 3a spirally wound serves as the inductor 3 and applies inductance to the alternating current. At this time, the ferromagnetic core 15 is magnetized in a direction of a magnetic field induced by the inductor 3, i.e., in the height direction, and serves as a magnetic core.

In the present embodiment, the inductor 3 that is a spiral inductor is formed by arranging the wiring 3a spirally. The ferromagnetic core 15 provided in the inner region 13 of the inductor 3 serves as the magnetic core of the inductor 3 and can improve the inductance and the Q value of the inductor 3. Moreover, since the height of the ferromagnetic core 15 is equal to or larger than the width thereof, the ferromagnetic core 15 is magnetized in the direction of the magnetic field induced by the inductor 3, i.e., in the height direction. Therefore, the inductance and the Q value of the inductor 3 can be further improved.

Figure 6A:
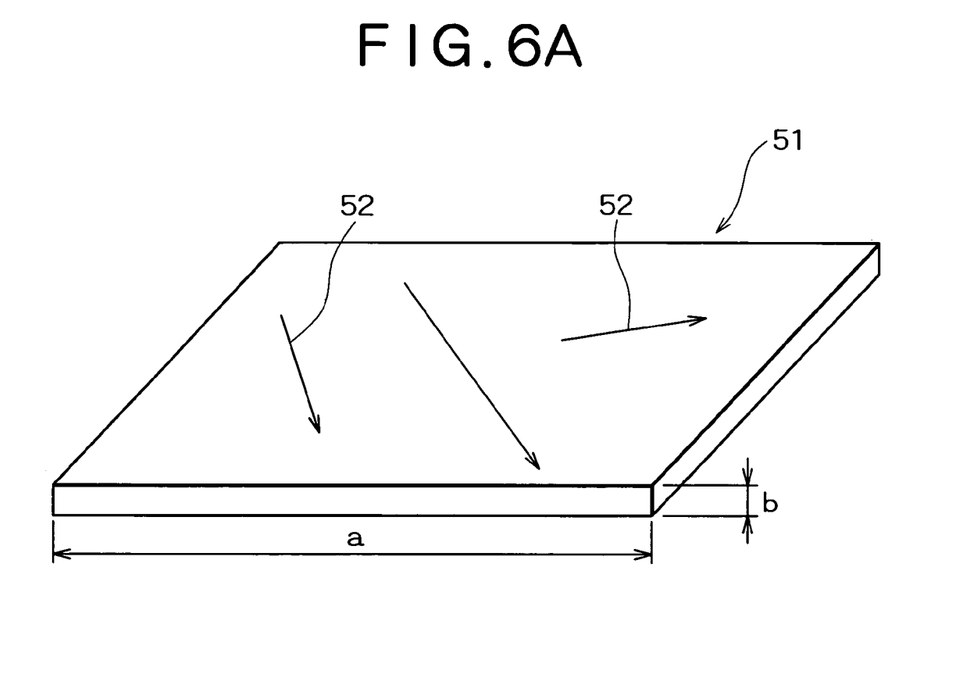
Figure 6B:
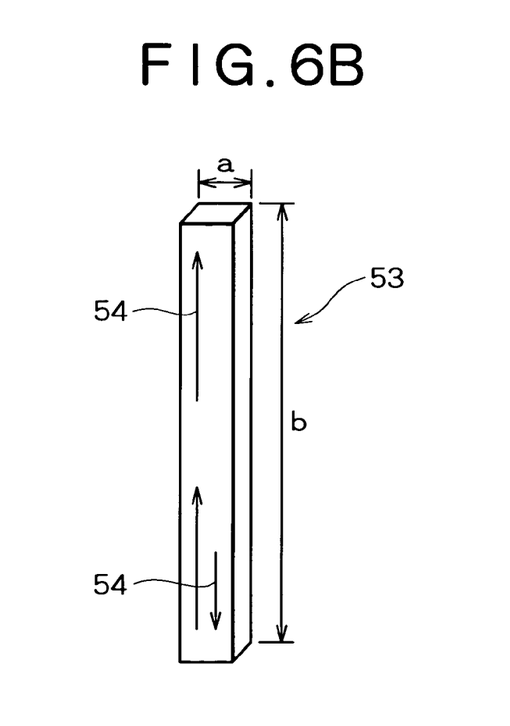

FIGS. 6A and 6B illustrate an effect of the shape of the ferromagnetic core on the magnetizing direction. FIG. 6A shows a case where the ferromagnetic core has the height smaller than the width, and FIG. 6B shows a case where the ferromagnetic core has the height larger than the width. The magnetizing direction of the ferromagnetic core depends on its shape. This is known as shape anisotropy of magnetization. As shown in FIG. 6A, in the case where the ferromagnetic core 51 is in the form of a thin film and its height (film thickness) b is smaller than its width a, magnetic moments can be easily aligned in a planar direction 52. Therefore, the ferromagnetic core 51 can be easily magnetized in its planar direction 52, whereas it is poorly magnetized in the height direction (thickness direction). On the other hand, as shown in FIG. 6B, in the case where the shape of the ferromagnetic core 53 is columnar and its height b is equal to or larger than its width a, i.e., an aspect ratio is equal to or larger than 1, the ferromagnetic core 53 is poorly magnetized in the width direction, whereas it is easily magnetized in the height direction 54.

The direction of the magnetic field (magnetic flux) induced by the inductor 3 is approximately coincident with the height direction in the inner region 13 of the inductor 3. Moreover, since the ferromagnetic core 15 is arranged in the inner region of the inductor 3 and the height of the ferromagnetic core 15 is set to be larger than the width thereof in the present embodiment, the direction of the magnetic field applied to the ferromagnetic core 15 is coincident with a direction in which the ferromagnetic core 15 is easily magnetized. As a result, when the inductor 3 induces the magnetic field, the ferromagnetic core 15 is easily magnetized in the direction of that magnetic field, i.e., in the height direction, thus improving the inductance and the Q value of the inductor 3. The aforementioned effect can be achieved in the case where the height of the ferromagnetic core 15 is equal to or larger than the width thereof, i.e., the aspect ratio is equal to or larger than 1. In addition, in the case where the height of the ferromagnetic core 15 is equal to or larger than twice the width thereof, i.e., the aspect ratio is equal to or larger than 2, the directions of the magnetic moments of the ferromagnetic core 15 are stabilized, so that the aforementioned effect can be achieved more surely.

In the present embodiment, a plurality of ferromagnetic cores 15 are provided for one inductor 3. Therefore, it is possible to make the height of the ferromagnetic core 15 equal to or larger than the width thereof without making the height excessively large beyond its limitation from a viewpoint of a typical fabrication process of a semiconductor device. Moreover, by arranging the ferromagnetic cores 15 with constant intervals to be away from each other, it is possible to prevent generation of magnetic interaction between the ferromagnetic cores 15. Furthermore, in the present embodiment, a plurality of ferromagnetic cores 15 are arranged in a matrix. Thus, a large number of ferromagnetic cores 15 can be arranged in a limited region while the adjacent ferromagnetic cores 15 are away from each other by a predetermined distance. As described above, the magnetic moments of the ferromagnetic core 15 can be aligned in the height direction in the present embodiment. Thus, the ferromagnetic core 15 can demonstrate the function as a magnetic core sufficiently.

In addition, the lower part of the ferromagnetic core 15 is located in the same level as the upper part of the wiring 3a. Therefore, the inductance and the Q value of the inductor 3 can be further improved. Moreover, the lower surface of the multilayer structure body 14 and the lower surface of the wiring 3a are located on the same plane, and the upper surface of the multilayer structure body 14 is in the upper level than the upper surface of the wiring 3a. Therefore, no parasitic capacitance is formed between the upper and lower surfaces of the multilayer structure body 14 and the wiring 3a, thus further improving the inductance and the Q value of the inductor 3. As a result of actual experiments, in the semiconductor integrated circuit of the present embodiment, shown in FIG. 3, the Q value was about twice the Q value in the conventional semiconductor integrated circuit shown in FIG. 1 or larger.

As described above, by improving the inductance and the Q value of the inductor 3, the size of the inductor 3 can be reduced as compared with that in the conventional semiconductor integrated circuit. Moreover, the size reduction of the inductor 3 reduces the length of the wiring 3a, so as to reduce the series resistance of the wiring 3a. Thus, the Q value of the inductor 3 can be further improved. The reduction of the series resistance of the wiring 3a and the improvement of the Q value of the inductor 3 can reduce the thickness of the wiring 3a as compared with that in the conventional semiconductor integrated circuit. Thus, the wiring 3a can be formed by a standard process, instead of a thick-film wiring process. Therefore any condition settings required for the thick-film wiring process and the like are not necessary, and the wiring 3a can be made finer. As a result, the size of the inductor 3 can be further reduced. This reduces an area occupied by the inductor in the semiconductor integrated circuit, so as to reduce the size of the semiconductor integrated circuit.

Moreover, in the present embodiment, the properties of the inductor 3 are affected mainly by the ferromagnetic core 15 because the ferromagnetic core 15 is provided in the inside of the inductor 3. Thus, the properties of the inductor 3 are poorly affected by its surrounding environment, i.e., the presence and absence of wiring, the distance from the adjacent wiring, and the like. As a result, the properties of the inductor 3 such as the inductance and the Q value, are stabilized.

In addition, in the conventional semiconductor integrated circuit shown in FIGS. 1 and 2, no conductive member is arranged above the inductor, whereas a conductive semiconductor substrate is arranged below the inductor. Therefore, a current is concentrated in the lower surface of the inductor because of a skin effect, so that electric resistance increases in appearance. On the other hand, in the present embodiment, a current also flows through the upper surface of the inductor 3 because the upper part of the multilayer structure body 14 is located in the upper level than the upper surface of the inductor 3. Therefore, the current flowing through the wiring 3a is made uniform. Thus, the electric resistance of the inductor 3 is reduced as compared with that in the conventional semiconductor integrated circuit, and the Q value is improved.

Furthermore, in the present embodiment, the ferromagnetic core 15 is covered with the Cu layers 9 and 10. Thus, Ni forming the ferromagnetic core 15 cannot be diffused to other regions in the semiconductor integrated circuit and cannot contaminate a fabrication apparatus in a fabrication process of the semiconductor integrated circuit.

In the present embodiment, an example has been described in which the winding number of the spiral wiring is three. However, the present invention is not limited thereto. The winding number may be four or more, or two or less, and may be one or less. Moreover, the shape of the spiral is not limited to a square. For example, the shape of the spiral may be a polygon other than a square or a circle. In addition, the present embodiment describes exemplary dimensions of the various parts. The present invention is not limited to those dimensions. Furthermore, the ferromagnetic core 15 may be formed of a ferromagnetic material other than Ni, for example, Co or Fe, and the wiring 3a may be formed of a conductive material other than Cu, for example, Al. Furthermore, the insulating layer 2 may be formed of SiON. In addition, the TiW layer 9 and the Cu layer 10 in the multilayer structure body 14 may be patterned to have the same shape as the ferromagnetic core 15 in a plan view.

Figure 7:
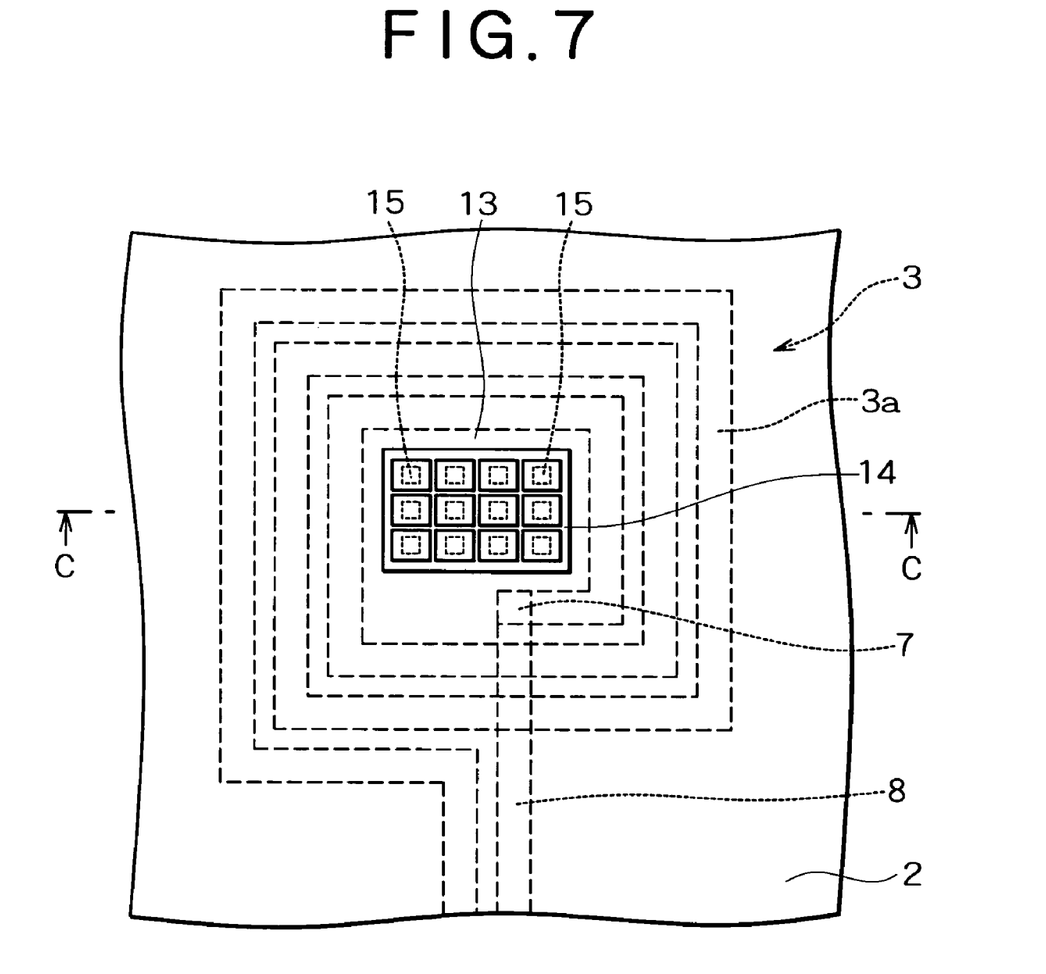
FIG. 7 is a plan view of a semiconductor integrated circuit according to a second embodiment of the present invention.
Figure 8:
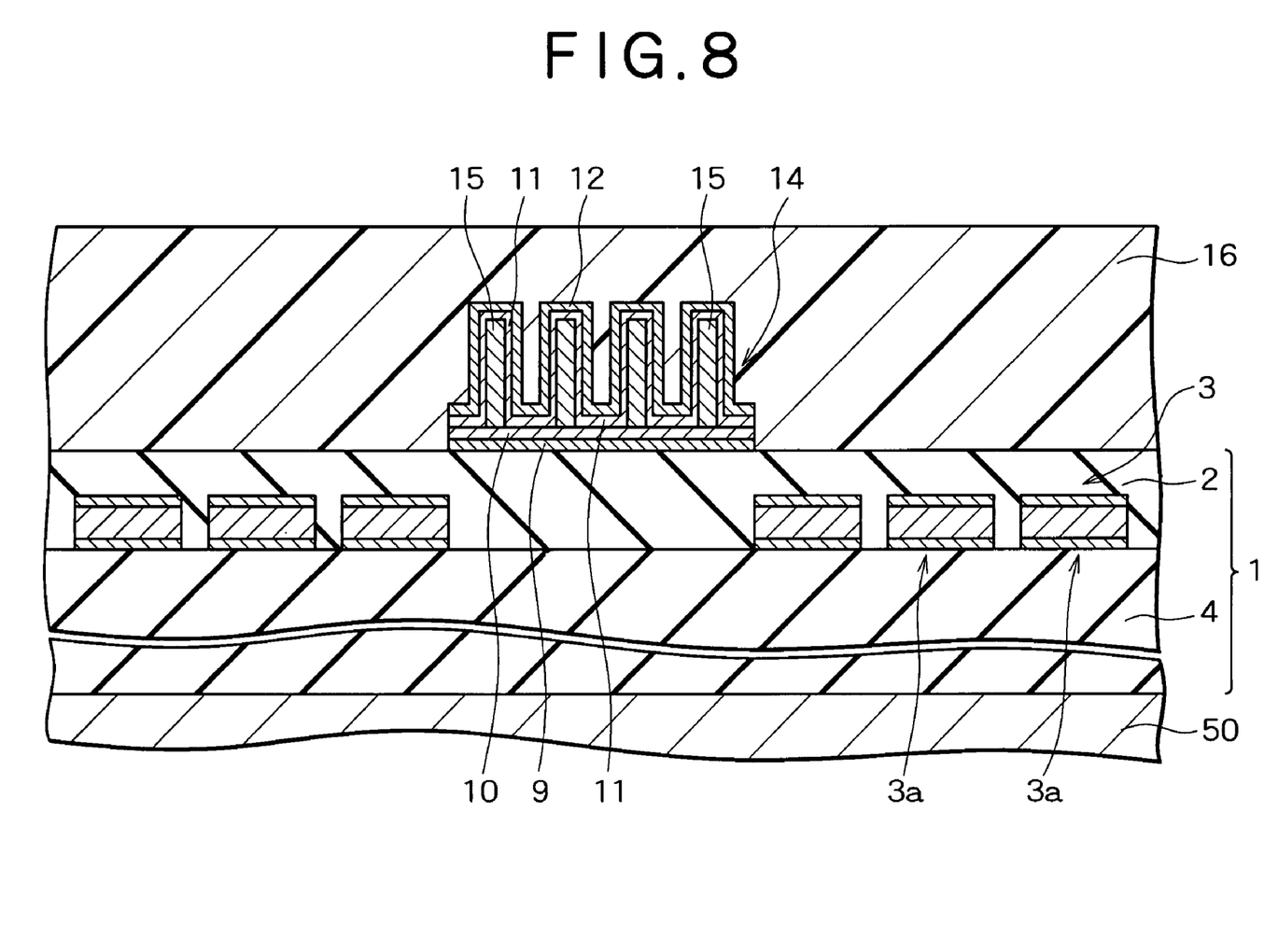
FIG. 8 is a cross-sectional view of the semiconductor integrated circuit shown in FIG. 7, taken along the line C-C in FIG. 7.

Next, a second embodiment of the present invention will be described. FIG. 7 is a plan view of a semiconductor integrated circuit of the present embodiment, and FIG. 8 is a cross-sectional view thereof, taken along the line C-C in FIG. 7. As shown in FIGS. 7 and 8, in the present embodiment, the inductor 3 is provided in the insulating layer 2 and the multilayer structure body 14 is provided on the insulating layer 2. In other words, the multilayer structure body 14 is arranged on the multilayer interconnection layer 1, and the inductor 3 is formed in the insulating layer 2 that forms the uppermost layer of the multilayer interconnection layer 1. The lower surface of the inductor 3 is located on the same plane as the lower surface of the inductor 2. Except for the above, the structure and operation of the semiconductor integrated circuit of the present embodiment are the same as those in the first embodiment.

In the present embodiment, the lower surface of the multilayer structure body 14 is located in the upper level than the upper surface of the inductor 3. Therefore, as compared with the first embodiment, the effect of causing the current to flow through the upper surface of the wiring 3a due to the aforementioned skin effect is large. Thus, a current distribution in the wiring 3a can be made more uniform, so that the resistance of the wiring 3a can be further reduced. The effects of the present embodiment other than the above effect are the same as those of the first embodiment.

Next, a third embodiment of the present invention will be described. The present embodiment relates to a fabrication method of the semiconductor integrated circuit of the first embodiment. FIGS. 9A to 9E are cross-sectional views showing respective processes of the fabrication method of the semiconductor integrated circuit according to the present embodiment, in an order in which the processes are performed. FIGS. 9A to 9E show a region corresponding to a part of FIG. 4.

Figure 9A:
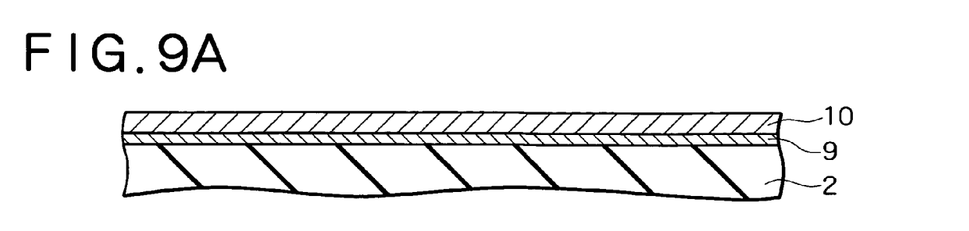
FIGS. 9A to 9E are cross-sectional views of a region corresponding to a part of FIG. 4, showing processes of a method for fabricating a semiconductor integrated circuit according to a third embodiment of the present invention in an order in which the processes are performed.

First, as shown in FIG. 9A, a multilayer interconnection layer 1 (see FIG. 4) is formed on a semiconductor substrate 50 (see FIG. 4). In the formation of the multilayer interconnection layer 1, a wiring 5 (see FIG. 5) and a wiring 8 (see FIG. 3) are embedded in an insulating layer 2 that forms the uppermost layer of the multilayer interconnection layer 1, and via holes 6 and 7 (see FIG. 3) are formed by etching in the insulating layer 2 directly above the wirings 5 and 8, respectively. In this etching, the wirings 5 and 8 serve as etching stopper layers when the via holes 6 and 7 are formed, respectively. Then, a TiW layer 9 is formed on the insulating layer 2 in all areas by sputtering. Next, a Cu layer 10 is formed on the TiW layer 9 by electroplating.

Figure 9B:
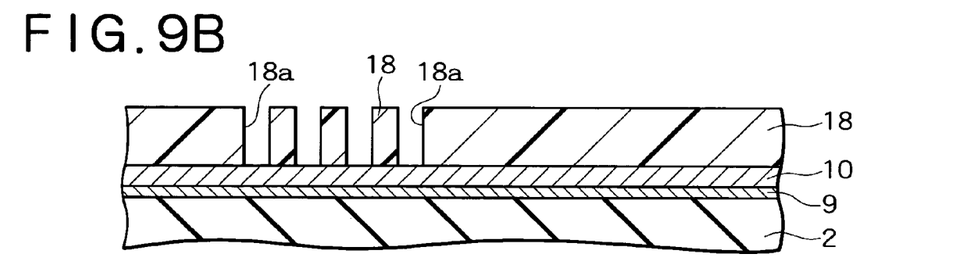

Next, as shown in FIG. 9B, a resist layer 18 is formed on the Cu layer 10, and a plurality of openings 18a are formed in regions of the resist layer 18 in which ferromagnetic cores 15 will be formed in a latter process. The openings 18a are formed by exposing the resist layer 18 with a mask having square openings to light and then developing the resist layer 18. However, the actual shape of the opening 18a thus formed is a square with rounded corners or a circle. The width of the opening 18a is 1 to 3 µm, for example. The openings 18a are arranged in a matrix with intervals of 1 to 3 µm, for example. In the opening 18a, the Cu layer 10 is exposed to the outside.

Figure 9C:
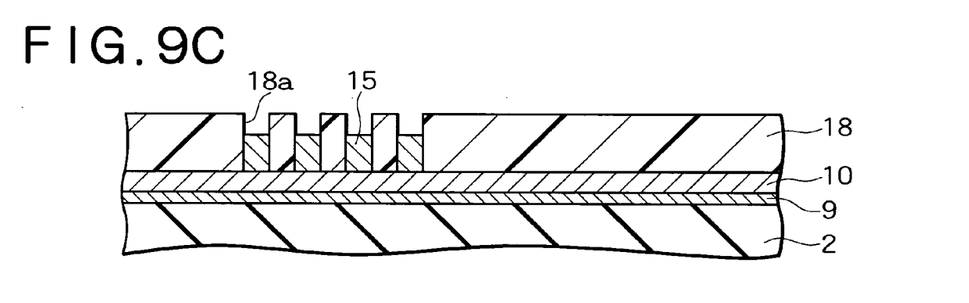

Next, as shown in FIG. 9C, electroplating of Ni is performed using the resist layer 18 as a mask, thereby forming ferromagnetic cores 15 of Ni on the Cu layer 10 in the regions corresponding to the openings 18a. The shape of each ferromagnetic core 15 is a square pole with rounded corners or a cylinder. The height of the ferromagnetic core 15 is 3 to 5 µm, and the width of thereof is 1 to 3 µm, for example. The ferromagnetic cores 15 are arranged in a matrix in a plan view.

Figure 9D:
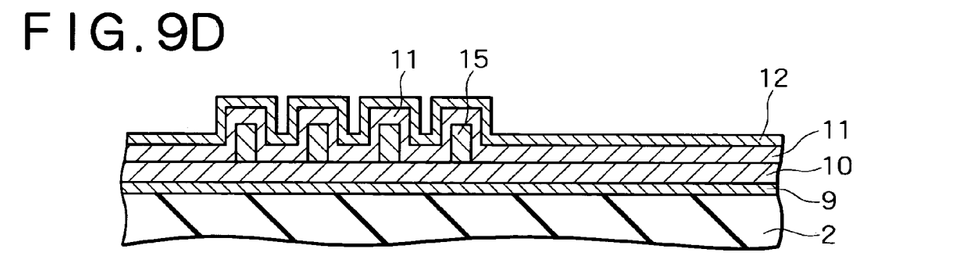

Next, as shown in FIG. 9D, the resist layer 18 is removed, and a Cu layer 11 is formed on the Cu layer 10 and the ferromagnetic cores 15. Then, a TiW layer 12 is formed to cover the Cu layer 11.

Figure 9E:
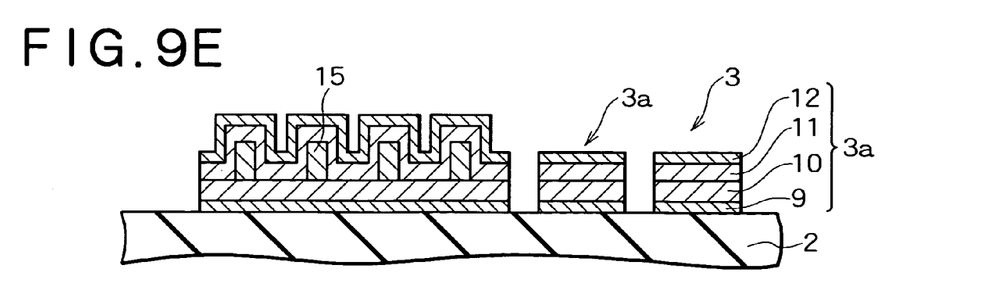

Next, as shown in FIG. 9E, a resist layer (not shown) is formed on the TiW layer 12. Then, using this resist layer as a mask, the TiW layer 9, the Cu layer 10, the Cu layer 11, and the TiW layer 12 are etched by wet etching, so that they are selectively removed and patterned. Wet etching of the Cu layers 10 and 11 can use SPM (sulfuric acid/hydrogen peroxide mixture) that is a mixture of sulfuric acid and hydrogen peroxide, while wet etching of the TiW layers 9 and 12 can use a hydrogen peroxide solution.

In this manner, as shown in FIGS. 3 to 5, a multilayer structure body 14 that is a square in a plan view and a wiring 3a that is spirally arranged to surround the multilayer structure body 14 and is connected to the wirings 5 and 8 through the via holes 6 and 7, respectively, are formed. The multilayer structure body 14 is formed of the TiW layer 9, the Cu layer 10, the ferromagnetic core 15, the Cu layer 11, and the TiW layer 12. The wiring 3a is formed of the TiW layer 9, the Cu layer 10, the Cu layer 11, and the TiW layer 12. Then, an insulating layer 16 of polyimide is formed on the insulating layer 2 in all areas to embed the multilayer structure body 14 and the wiring 3a therein. In this manner, the semiconductor integrated circuit according to the first embodiment can be fabricated.

Next, a fourth embodiment of the present invention will be described. The present embodiment relates to a fabrication method of the semiconductor integrated circuit of the second embodiment. FIGS. 10A to 10E are cross-sectional views showing respective processes of the fabrication method of the semiconductor integrated circuit of the present embodiment in an order in which the processes are performed. FIGS. 10A to 10E show a region corresponding to a part of FIG. 8.

First, as shown in FIG. 8, a multilayer interconnection layer 1 is formed on a semiconductor substrate 50. At this time, an inductor 3 is formed by a typical method in an insulating layer 2 that forms the uppermost layer of the multilayer interconnection layer 1.

Then, as shown in FIGS. 10A to 10D, a TiW layer 9, a Cu layer 10, a ferromagnetic layer 15, a Cu layer 11, and a TiW layer 12 are formed on the insulating layer 2 in all areas in that order. The processes shown in FIGS. 10A to 10D are the same as those shown in FIGS. 9A to 9D in the third embodiment described above.

Figure 10A:
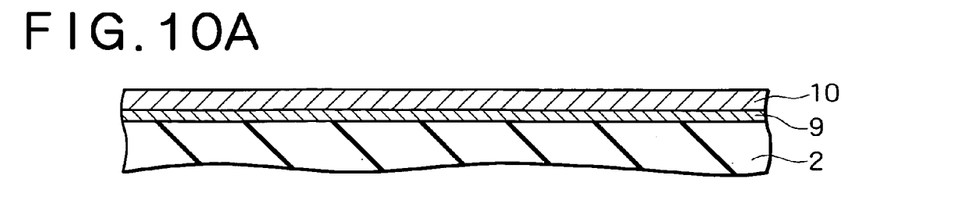
FIGS. 10A to 10E are cross-sectional views of a region corresponding to a part of FIG. 8, showing processes of a method for fabricating a semiconductor integrated circuit according to a fourth embodiment of the present invention in an order in which the processes are performed.
Figure 10B:
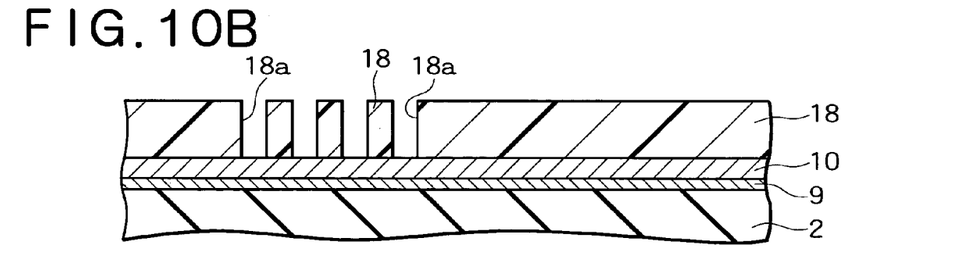
Figure 10C:
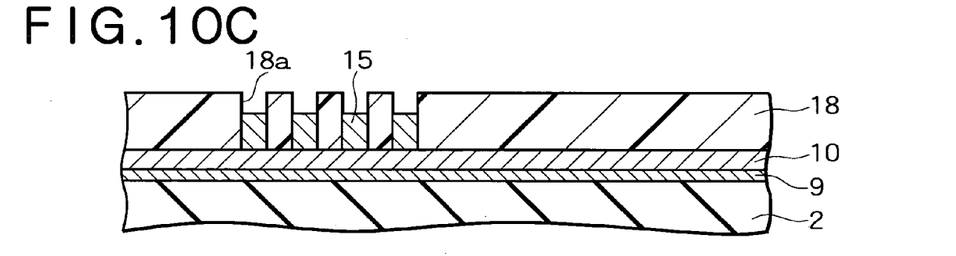
Figure 10D:
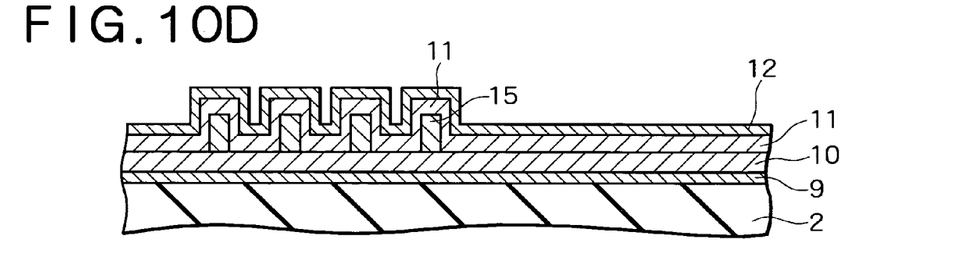
Figure 10E:
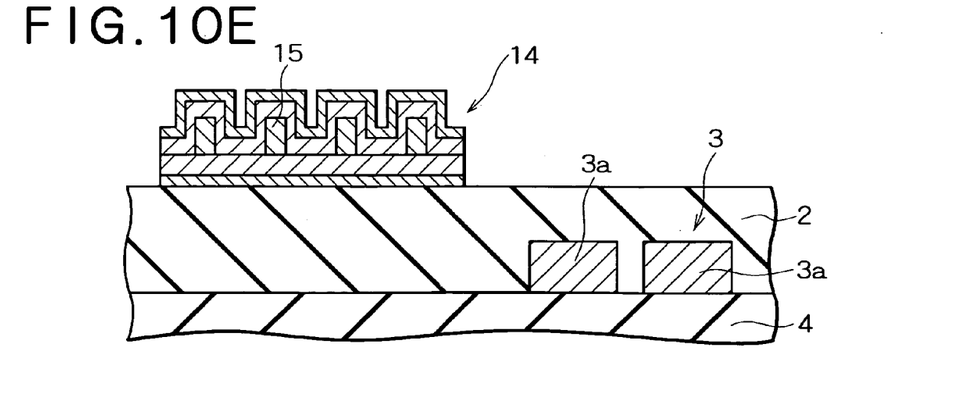

Next, as shown in FIG. 10E, a resist layer (not shown) is formed on the TiW layer 12. Then, using this resist layer as a mask, the TiW layer 9, the Cu layer 10, the Cu layer 11, and the TiW layer 12 are etched by wet etching, so that they are selectively removed and patterned. Wet etching of the Cu layers 10 and 11 can use SPM that is a mixture of sulfuric acid and hydrogen peroxide, while wet etching of the TiW layers 9 and 12 can use a hydrogen peroxide solution.

In this manner, a multilayer structure body 14 having a square shape is formed in a region corresponding to the inside of the inductor 3 in a plan view. The multilayer structure body 14 is formed of the TiW layer 9, the Cu layer 10, the ferromagnetic layer 15, the Cu layer 11, and the TiW layer 12. Then, an insulating layer 16 is formed of polyimide on the insulating layer 2 in all areas to embed the multilayer structure body 14. Thus, the semiconductor integrated circuit of the second embodiment can be fabricated.

The shape of the ferromagnetic core 15 is columnar, for example, as described in the first to fourth embodiments. However, the present invention is not limited thereto. The ferromagnetic core 15 may have any shape as long as its height is equal to or larger than its width.

What is claimed is:

1. A semiconductor integrated circuit comprising:
   an inductor provided on a substrate; and
   a plurality of ferromagnetic cores, each of said cores are formed as one unit and are provided in an inner region of said inductor when seen from a direction perpendicular to a surface of said substrate, without disposing any ferromagnetic core in an outer region of said inductor when seen from a direction perpendicular to a surface of said substrate, wherein a length of each of said ferromagnetic core in the direction perpendicular to the surface of said substrate is equal to or larger than a length thereof in a direction parallel to the surface of said substrate.

2. The semiconductor integrated circuit according to claim 1, wherein the length of said ferromagnetic cores in the direction perpendicular to the surface of said substrate is equal to or larger than twice the length thereof in the direction parallel to the surface of said substrate.

3. The semiconductor integrated circuit according to claim 1, wherein said plurality of ferromagnetic cores are arranged in a matrix.

4. A semiconductor integrated circuit comprising:
   an inductor provided on a substrate; and
   a plurality of ferromagnetic cores, each of said cores are formed as one unit and are provided in an inner region of said inductor when seen from a direction perpendicular to a surface of said substrate, wherein a length of each of said ferromagnetic cores in the direction perpendicular to the surface of said substrate is equal to or larger than a length thereof in a direction parallel to the surface of said substrate;
   wherein a multilayer interconnection layer is provided on said substrate, and said ferromagnetic cores and said inductor are formed on said multilayer interconnection layer.

5. A semiconductor integrated circuit comprising:
   an inductor provided on a substrate;
   a ferromagnetic core provided in an inner region of said inductor when seen from a direction perpendicular to a surface of said substrate, wherein a length of said ferromagnetic core in the direction perpendicular to the surface of said substrate is equal to or larger than a length thereof in a direction parallel to the surface of said substrate a first metal layer provided in the region corresponding to the inner region of said inductor and below said ferromagnetic core; and a second metal layer provided to cover an upper surface and side faces of said ferromagnetic core.

6. The semiconductor integrated circuit according to claim 5, wherein an upper surface of said second metal layer is located in an level higher than an upper surface of said inductor.

7. The semiconductor integrated circuit according to claim 5, wherein said inductor has a multilayer structure in which said second metal layer is formed on said first metal layer.

8. The semiconductor integrated circuit according to claim 5, wherein said inductor, said first metal layer, and said second metal layer are formed of copper, aluminum, or an alloy thereof.

9. The semiconductor integrated circuit according to claim 1, wherein said ferromagnetic cores are formed of nickel or a nickel alloy.

10. The semiconductor integrated circuit according to claim 1, wherein said inductor is a spiral inductor.

11. The semiconductor integrated circuit according to claim 1, wherein a multilayer interconnection layer is provided on said substrate and said ferromagnetic cores are formed outside said multilayer interconnection layer.

12. The semiconductor integrated circuit according to claim 1, wherein the length of each of said ferromagnetic cores in the direction perpendicular to the surface of said substrate is larger than the length thereof in the direction parallel to the surface of said substrate.

13. The semiconductor integrated circuit according to claim 1, wherein the substrate is a semiconductor substrate.

14. The semiconductor integrated circuit according to claim 4, wherein the length of said ferromagnetic cores in the direction perpendicular to the surface of said substrate is equal to or larger than twice the length thereof in the direction parallel to the surface of said substrate.

15. The semiconductor integrated circuit according to claim 4, wherein said plurality of ferromagnetic cores are arranged in a matrix.

16. The semiconductor integrated circuit according to claim 4, wherein said ferromagnetic cores are formed of nickel or a nickel alloy.

17. The semiconductor integrated circuit according to claim 4, wherein said inductor is a spiral inductor.

* * * * *